(12) United States Patent
Tsai et al.

(10) Patent No.: US 7,446,047 B2
(45) Date of Patent: Nov. 4, 2008

(54) METAL STRUCTURE WITH SIDEWALL PASSIVATION AND METHOD

(75) Inventors: Minghsing Tsai, Chu-Pei (TW); Yung-Cheng Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 246 days.

(21) Appl. No.: 11/061,350

(22) Filed: Feb. 18, 2005

(65) Prior Publication Data

US 2006/0189143 A1      Aug. 24, 2006

(51) Int. Cl.
*H01L 21/311* (2006.01)
(52) U.S. Cl. .................. 438/700; 438/597; 438/639; 257/773; 257/776
(58) Field of Classification Search .............. 438/597, 438/618, 623, 639, 700, 773, 513, 723, 724, 438/743, 744, 755, 756; 257/773, 776
See application file for complete search history.

(56) References Cited

U.S. PATENT DOCUMENTS

| | | | | | |
|---|---|---|---|---|---|
| 5,670,828 | A | * | 9/1997 | Cheung et al. | 257/773 |
| 5,759,906 | A | * | 6/1998 | Lou | 438/623 |
| 5,814,558 | A | * | 9/1998 | Jeng et al. | 438/623 |
| 5,858,869 | A | * | 1/1999 | Chen et al. | 438/597 |
| 5,948,700 | A | * | 9/1999 | Zheng et al. | 438/694 |
| 6,130,154 | A | * | 10/2000 | Yokoyama et al. | 438/627 |
| 6,162,583 | A | * | 12/2000 | Yang et al. | 430/313 |
| 6,169,039 | B1 | * | 1/2001 | Lin et al. | 438/761 |
| 6,214,423 | B1 | * | 4/2001 | Lee et al. | 427/492 |
| 6,444,564 | B1 | * | 9/2002 | Raeder | 438/618 |
| 6,445,072 | B1 | * | 9/2002 | Subramanian et al. | 257/758 |
| 2005/0079703 | A1 | * | 4/2005 | Chen et al. | 438/633 |
| 2005/0156317 | A1 | * | 7/2005 | Yau et al. | 257/760 |

OTHER PUBLICATIONS

Balci, N., et al., "Electrically Conductive Polymer Grafts Prepared By Electrochemical Polymerization of Pyrrole onto Poly[(methyl methacrylate)-co-(2-(N-pyrrolyl) Ethyl Methacrylate)] Electrodes," Tr. J. of Chemistry, 22, 1998, pp. 73-80.

Ozanam, F., et al., "Kinetics Of Electrochemical Grafting Of Silicon With Organic Species," http://www.lure.u-psud.fr/VAS10/abstracts/O-08.pdf.

(Continued)

*Primary Examiner*—Phuc T Dang
(74) *Attorney, Agent, or Firm*—Slater & Matsil, L.L.P.

(57) ABSTRACT

A passivated metal structure and a method of forming the metal structure is disclosed. According to one embodiment, the patterned metal structure, such as conductive lines, are formed on a substrate. The copper lines are passivated by a polymer liner between the copper lines and a low k dielectric filling the spaces between the conductive lines. The polymer liner is preferably deposited on the sidewalls of the conductive lines by electro-grafting. The polymer liner may also be used in a damascene process according to a second embodiment.

13 Claims, 6 Drawing Sheets

OTHER PUBLICATIONS

Frank, C.W., et al., "Center on Polymer Interfaces and Macromolecular Assemblies," Final Report to the National Science Foundation Materials Reseach Science and Engineering Center Program, Jun. 26, 2003, pp. 1, 8, 11-14, 49-54.

"Passivation materials for polymer electronics," Fraunhofer ISC Annual Report, 2002, pp. 46-47.

Rappich, Dr. J., "Thin organic layers on silicon," http://www.hmi.de/bereiche/Se/vip/organics/projects/passivation_en.html, Aug. 10, 2003, pp. 1-2.

Kalem, S., "Possible low-k solution and other potential applications," www.eurosemi.eu.com/front-end/printer-friendly.php?newsid=5492, Jul. 1, 2004, pp. 1-7.

* cited by examiner

METAL STRUCTURE WITH SIDEWALL PASSIVATION AND METHOD

TECHNICAL FIELD

The present invention relates to patterned metal structures having passivated sidewalls and formed on a semiconductor substrate. The passivated sidewalls of the patterned metal structure are particularly suitable for semiconductor structures subject to oxidation during subsequent process steps. More specifically, the invention relates to the use of a protective polymer lining selectively deposited on the sidewalls to reduce or eliminate such oxidation.

BACKGROUND

Increasing demands to reduce the geometry of semiconductor devices while at the same time increasing the number of devices on a semiconductor chip has resulted in significant changes in the manufacturing process of semiconductors. For example, as the size of the individual semiconductor elements on a chip decrease and the number of elements increases, the capacitance between conductive lines connecting elements has become a significant problem. To help reduce the problem, copper, copper alloys and other highly conductive metals are being used instead of aluminum. Unfortunately, use of these metals in semiconductor devices presents their own problems. For example, whereas in the past aluminum could be deposited, patterned by a photoresist and then etched to produce a desired conductive line structure, such processes are not suitable for copper and most other high conductive materials. Therefore, the damascene and/or dual damascene processes are often used to form the conductive lines. In addition, reduction of line to line capacitance with present day devices also requires dielectric materials with very low k or dielectric constants. For example, less than about 3.0. Unfortunately, these dielectrics and especially the low k dielectrics are very susceptible to the migration of copper ions from the copper conductive lines into the dielectric. This, of course is disastrous if the material is to be used as a dielectric.

To stop the ion migration, there have been various attempts to passivate the copper/dielectric material interface wherein such low lc materials are used to fill between the copper lines. For example, certain conductive metals and metal compounds such tantalum. tantalum nitride, titanium, titanium nitride, and tungsten do not themselves create major migration problems and can be used as a barrier between the copper and the dielectric to stop the copper ions from migrating. Of course, being a conductive material, these barrier metals must be carefully deposited so that they cover only the copper and not the dielectric material. Otherwise the conductive metal could cause shorts between conductive lines or components that require cicetrical isolation from each other. Therefore, referring to FIG. 1 and FIG. 2A, it is seen that this prior art technique has been used where the barrier metal 10 selectively adheres to the exposed copper sidewalls 12 of the conductive lines 14a, 14b, and 14c while at the same time the treated top surface 16 of the conductive lines 14a, 14b, and 14c and the top surface 18 of the substrate 20 selectively avoid the deposition of the baffler metal 10. Of course, if the "selectivity" of the substrate and areas not intended to receive the barrier metal 10 fails and the metal is unintentionally deposited in these areas, electric shorts will be created.

Another prior art technique, as illustrated in FIG. 2B, includes the depositing of a blanket layer of a high k dielectric material 22 aver the copper lines 14a, 14b, and 14c and the top surface 18 of the substrate 20. The high k dielectric material is selected to be sufficiently dense to stop the ion migration, yet thin enough so as not to significantly raise the over all dielectric constant of the combination dense layer 22 of dielectric and the low k dielectric that will fill between the conductive lines 14a, 14b, and 14c to an unacceptable high value. This approach unfortunately has several problems. First, there is poor adhesion between the metal (such as copper) forming the conductive lines and the dense dielectric. Second, a sufficiently dense dielectric will still noticeably raise the dielectric constant of the combination of materials. In addition, the deposition process is typically a high temperature process that causes SM (Stress Migration) issues. Therefore1 a process that retains a low k value That can be carried out at a low or room temperature and still possess good adhesion to metal would be advantageous.

SUMMARY OF THE INVENTION

These and other problems are generally solved or circumvented, and technical advantages are generally achieved, by preferred embodiments of the present invention, which include methods to passivate the patterned conductive metal structures such as conductive lines.

The passivation technique of the present invention comprises forming a patterned metal structure such as conductive lines and/or vias on the substrate, which includes spaces between different parts of the structure or conductive lines. The patterned metal structure is typically formed from a metal that is susceptible to oxidation, such as for example, copper. According to one embodiment, prior to depositing a low k dielectric over the substrate and the patterned metal structure, including the spaces between adjacent structure portions, a polymer liner such as a nitrogen containing polymer. An example of a suitable polymer liner is acrylate and polypeptide deposited preferably by electro-grafting over at least any exposed metal portions, such as sidewalls of the patterned metal structure. The polymer liner has a low k value and is deposited at low temperatures and has excellent adhesion qualities. Further, because the polymer liner is deposited at low temperatures, there are no stress migration issues. According to another embodiment, the polymer liner can be deposited on the sidewalls of the vias and trenches formed in a low k material for use with a damascene or dual damascene process.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
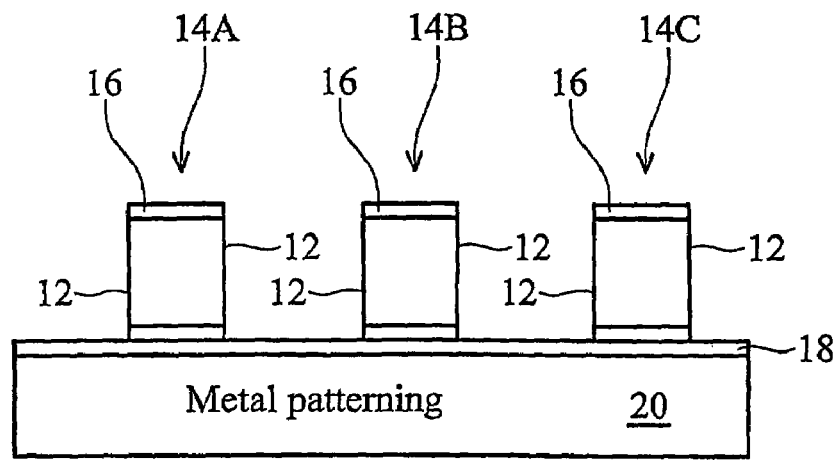
FIG. 1 shows a typical prior art semiconductor structure that includes a patterned metal or copper conductive lines on a substrate.
Figure 3A:
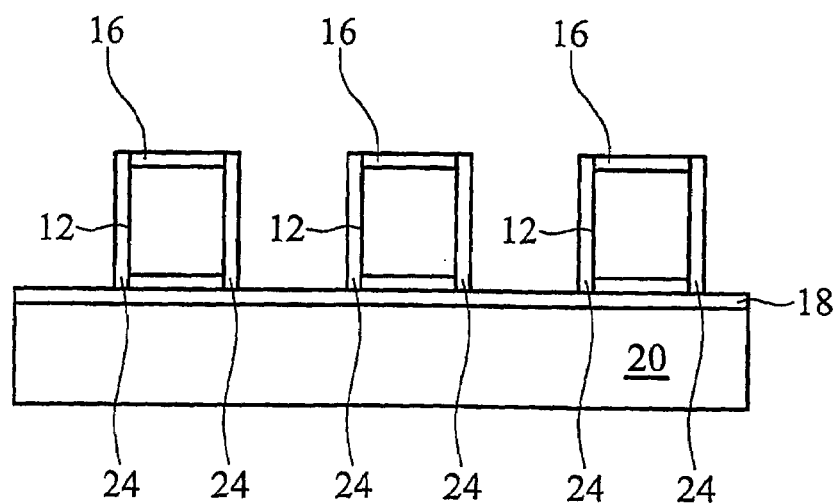
FIG. 3A illustrates the structure of FIG. 1 with a polymer liner selectively deposited on the side walls of a conductive lines according to the embodiment of the present invention.

Referring now to FIG. 3A there is illustrated a first embodiment of the present invention. As shown, the prior art non-passivated patterned metal structure of FIG. 1 now includes a non-conductive polymer liner 24 selectively deposited on the sidewalls 12 only of the patterned metal (copper) structure. As will be described hereinafter, a layer of between about 5 Å to about 1000 Å of polymer liner 24 is preferably deposited by electro-grafting to the copper sidewalls. The polymer liner will typically be comprised of carbon, fluoride, nitrogen, and oxygen. One suitable polymer liner is N-succinimidyl acrylate and polypeptide. The use of the selectively deposited polymer liner 24 as illustrated in FIG. 3A provides a very important advantage over the prior art technique of selectively depositing a barrier metal. Namely, if the "selectivity" fails, (i.e. the polymer is deposited on unintended surfaces), since the polymer layer is non-conductive, there is no concern about electrical shorts.

Figure 2A:
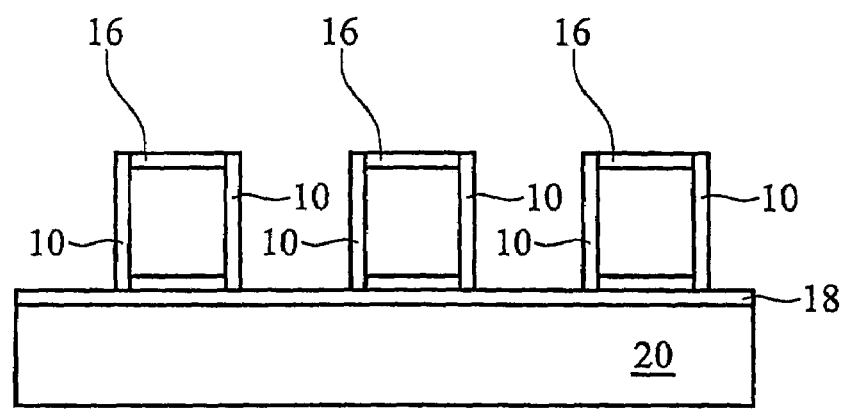
FIG. 2A illustrates the structure of FIG. 1 with a metal liner selectively deposited on the sidewalls of the conductive lines according to the prior art.
Figure 2B:
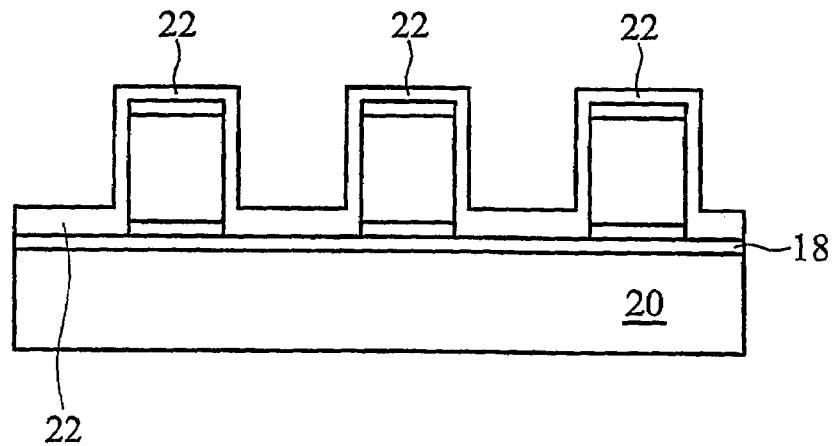
FIG. 2B illustrates the structure of FIG. 1 with a dielectric liner blanket deposited over the substrate and the conductive lines according to another prior art embodiment.
Figure 3B:
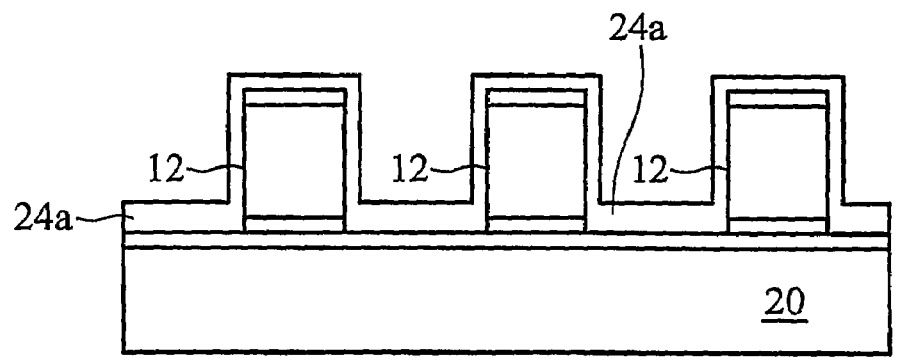
FIG. 3B illustrates the structure of FIG. 1 with a polymer liner blanket deposited over the substrate and the conductive lines according to another embodiment of the present invention.

In a similar manner, the polymer liner may also be deposited as a 5 Å to 1000 Å blanket layer 24a as illustrated in FIG. 3B. Suitable polymers for such a blanker passivation layer is also N-succinimidyl acrylate and polypeptide, and may be deposited by electrografting. Use of a blanket polymer liner avoids substantially all of the problem areas discussed above with respect to FIG. 2B and the use of a dielectric blanket layer 22 for passivation. Namely, the polymer has good to excellent adhesion with the exposed metal. Further, the polymer is itself a rather low k material and therefore the combined dielectric constant of the polymer liner and the dielectric layer between the conductive lines is not raised to an unacceptable level. The deposition takes place at room temperature, and therefore there are no SM (Stress Migration) issues.

Figure 4:
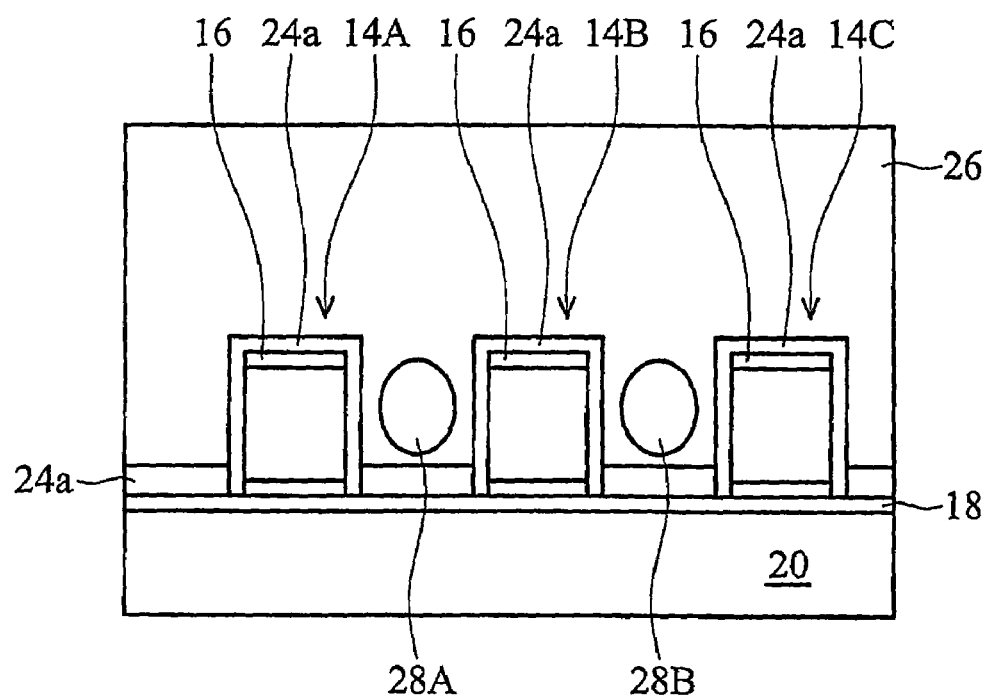
FIG. 4 illustrates further processing steps and structure suitable for use with the structure of FIGS. 3A and 3B according to the present invention.

FIG. 4 illustrates the blanket layer embodiment of FIG. 3B with a low k or ultra low k dielectric 26 deposited over the conductive lines 14a, 14b, and 14c and the substrate 20. For example, the dielectric material will typically have a dielectric constant no greater than about 3.0, and preferably between about 1.9 and 2.5. As shown, the dielectric material 26 may be porous or include air gaps such as the air gap 28a and 28b shown in FIG. 4. It should also be appreciated that the composite structure in FIG. 4 is also applicable to the embodiment of FIG. 3A wherein the polymer liner is selectively deposited only on the exposed metal surfaces of the conductive lines.

Figure 5:
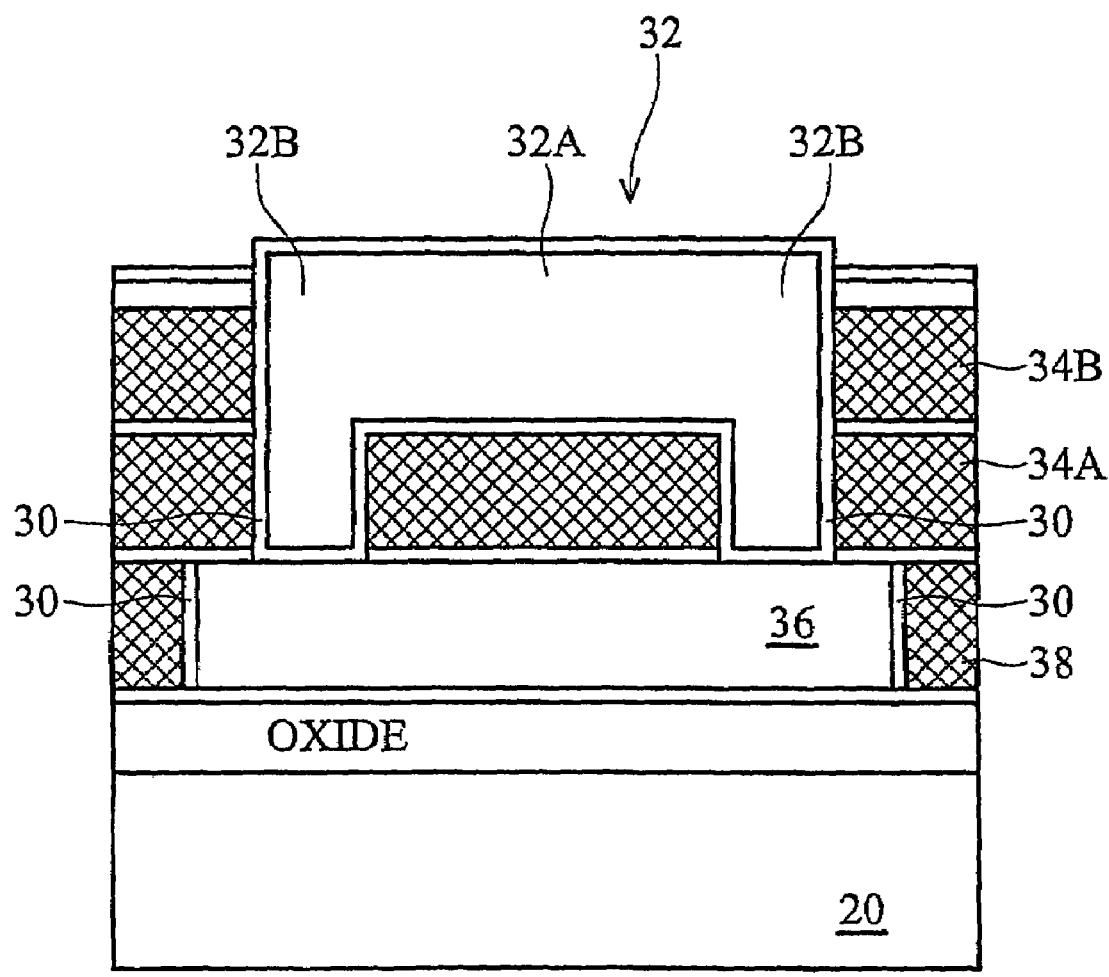
FIG. 5 illustrates that the plasma liner may be deposited on the sidewall surfaces of a low k dielectric material for use with both a damascene and a dual damascene process.

FIG. 5 illustrates that the use of a polymer material as a passivation liner between the copper and a dielectric is also applicable to a damascene or dual damascene patterned copper structure. As shown in FIG. 5, the polymer liner 30 may be used to passivate the interference between copper damascene structure 32 (includes conductive lines or traces 32a and connecting vias 32b) from the dielectric layers 34a and 34b. The illustration also shows a first metal layer 36 that could also be passivated by the polymer liner 38 of the present invention.

Figure 6A:
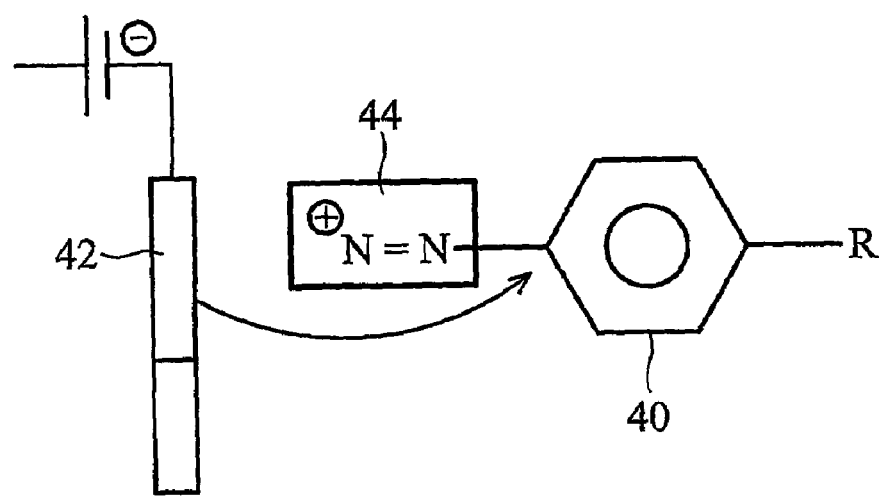
FIGS. 6A, 6B, and 6C illustrate the process of depositing a poly liner by electro-grafting for use with the present invention.
Figure 6B:
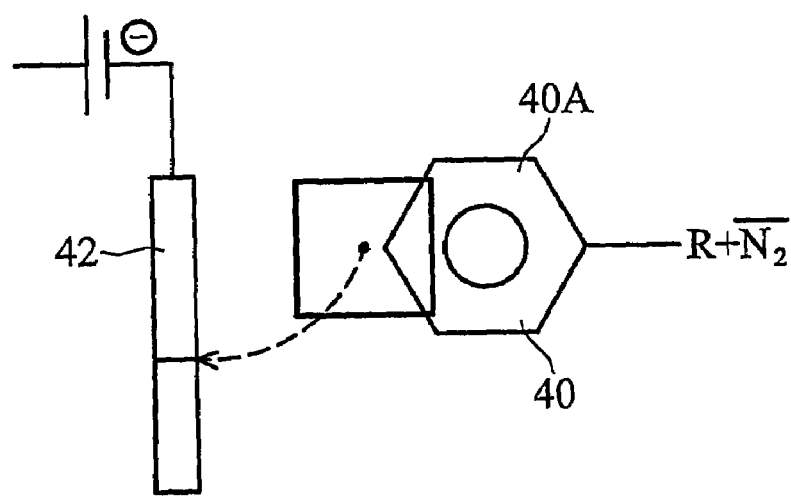
Figure 6C:
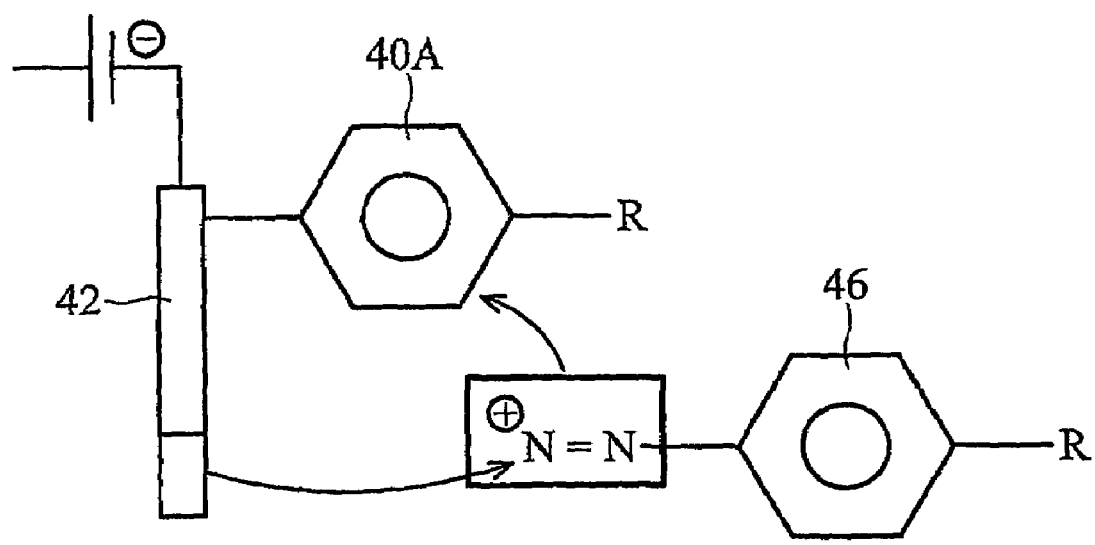

Referring now to FIGS. 6A, 6B, and 6C, there is illustrated an electro-grafting process for depositing the polymer liner. As shown in FIG. 6A, a group of polymer molecules, such as molecule 40 that include nitrogen ions 44 with a positive charge are attracted to the negative charged electrode 42 (e.g. the exposed copper sidewall discussed in FIG. 3A and shown in FIG. 6A). This electro activation reduces the group of molecules by releasing the nitrogen ions, which combine as $N_2$ as shown in FIG. 6B. The reduced polymer molecule 40a bonds with the negatively charged copper surface 42 (electrode) also shown in FIG. 6B. This process leaves a polymer film bonded to and covering the exposed copper. The bonded polymer molecules 40a themselves are then charged and attract and bond to other polymer molecules such as molecule 40 as indicated in FIG. 6C. This "plating" process continues until the desired liner thickness of between about a few nm (nanometers) to several μm (micro nanometers) is achieved. As previously discussed, a polymer liner of between about 5 Å to 1000 Å is preferred.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, composition of matter, means, methods and steps described in the specification. As one of ordinary skill in the art will readily appreciate from the disclosure of the present invention, processes, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, compositions of matter, means, methods, or steps.

What is claimed is:

1. A method of passivating sidewalls of a patterned metal structure comprising the steps of:
   providing a substrate;
   forming patterned metal structures over said substrate, said patterned metal structures having spaces there between;
   depositing a low k dielectric material over said substrate, said low k dielectric material filling the spaces between said patterned metal structures; and providing a protective polymer liner between selective portions of said patterned metal structure and said low k dielectric material by depositing said protective polymer liner by electro-grafting, wherein said protective polymer liner is deposited to a thickness of between about 5 Å (angstroms) and about 1000 Å (angstroms).

2. A method of passivating sidewalls of a patterned metal structure comprising the steps of:
providing a substrate;
forming patterned metal structures over said substrate, said patterned metal structures having spaces there between;
depositing a low k dielectric material over said substrate, said low k dielectric material filling the spaces between said patterned metal structures; and
providing a protective polymer liner between selective portions of said patterned metal structure and said low k dielectric material, wherein said protective polymer liner comprises a material selected from the group consisting of carbon, fluorine, hydrogen, nitrogen, and oxygen, and wherein said protective polymer liner is deposited to a thickness of between about 5 Å (angstroms) and about 1000 Å (angstroms).

3. The method of claim 2 wherein said protective polymer liner is N-succinimidyl acrylate and polypeptide.

4. The method of claim 1 wherein said protective polymer liner is selectively deposited on the passivating sidewalls of said patterned metal structure prior to depositing said low k dielectric material.

5. The method of claim 1 wherein said protective polymer liner is deposited as a blanket layer over said substrate and said patterned metal structures prior to depositing the low k dielectric material.

6. The method of claim 1 wherein said patterned metal structures are patterned copper structures.

7. The method of claim 1 wherein at least a portion of said patterned metal structures is formed as a damascene metal structure.

8. The method of claim 1 wherein said low k dielectric material has a dielectric constant of less than 3.0.

9. The method of claim 2 wherein said protective polymer liner is selectively deposited on the passivating sidewalls of said patterned metal structure prior to depositing said low k dielectric material.

10. The method of claim 2 wherein said protective polymer liner is deposited as a blanket layer over said substrate and said patterned metal structure prior to depositing the low k dielectric material.

11. The method of claim 2 wherein said patterned metal structures are patterned copper structures.

12. The method of claim 2 wherein at least a portion of said patterned metal structures is formed as a damascene metal structure.

13. The method of claim 2 wherein said low k dielectric material has a dielectric constant of less than 3.0.

* * * * *

UNITED STATES PATENT AND TRADEMARK OFFICE
CERTIFICATE OF CORRECTION

PATENT NO.        : 7,446,047 B2  
APPLICATION NO.  : 11/061350  
DATED             : November 4, 2008  
INVENTOR(S)       : Tsai et al.

It is certified that error appears in the above-identified patent and that said Letters Patent is hereby corrected as shown below:

In Col. 1, line 36, delete "constants. For" and insert --constants, for--.  
In Col. 1, line 43, delete "Ic" and insert --k--.  
In Col. 1, line 44, delete "conductivc" and insert --conductive--.  
In Col. 1, line 45, delete "such tantalum." and insert --such as tantalum,--.  
In Col. 1, line 53, delete "cicetrical" and insert --electrical--.  
In Col. 1, line 60, delete "baffler" and insert --barrier--.  
In Col. 1, line 66, delete "aver" and insert --over--.  
In Col. 2, line 13, delete "Therefore1" and insert --Therefore,--.  
In Col. 2, line 13, delete "That" and insert --that--.  
In Col. 3, line 8, delete "a" and insert --the--.  
In Col. 3, line 53, delete "blanker" and insert --blanket--.

Signed and Sealed this

Twentieth Day of January, 2009

JON W. DUDAS  
*Director of the United States Patent and Trademark Office*